United States Patent [19]
Robinson

[11] 3,988,648
[45] Oct. 26, 1976

[54] PROTECTIVE CARRIER FOR MICROCIRCUIT DEVICES

[75] Inventor: Lyle A. Robinson, Raytown, Mo.

[73] Assignee: The United States of America as represented by the United States Research and Development Administration, Washington, D.C.

[22] Filed: July 18, 1975

[21] Appl. No.: 597,270

[52] U.S. Cl. .................. 317/101 CC; 339/17 CF
[51] Int. Cl.² .......................................... H05K 1/04
[58] Field of Search ............ 317/101 CC, 101 CD, 317/101 F; 339/17 CF; 324/158 P

[56] References Cited
UNITED STATES PATENTS

| | | | |
|---|---|---|---|
| 3,319,166 | 5/1967 | Coleman | 317/101 CP |
| 3,405,361 | 10/1968 | Kattner et al. | 317/101 CC |
| 3,823,350 | 7/1974 | Stoner | 317/101 CC |

Primary Examiner—David Smith, Jr.
Attorney, Agent, or Firm—Dean F. Carlson; Dudley W. King; Ignacio Resendez

[57] ABSTRACT

An improved protective carrier for microcircuit devices having beam leads wherein a compressible member is disposed on the carrier base beneath and overlapping the periphery of an aperture in a flexible circuit element, the element being adapted to receive and make electrical contact with microcircuit device beam leads, the compressible member disposed or arranged to achieve flexing of the circuit element against the microcircuit device beam leads to conform to variations in thicknesses of the device beam leads or circuit element electrical paths and thereby insure electrical connection between the beam leads and the electrical paths.

5 Claims, 4 Drawing Figures

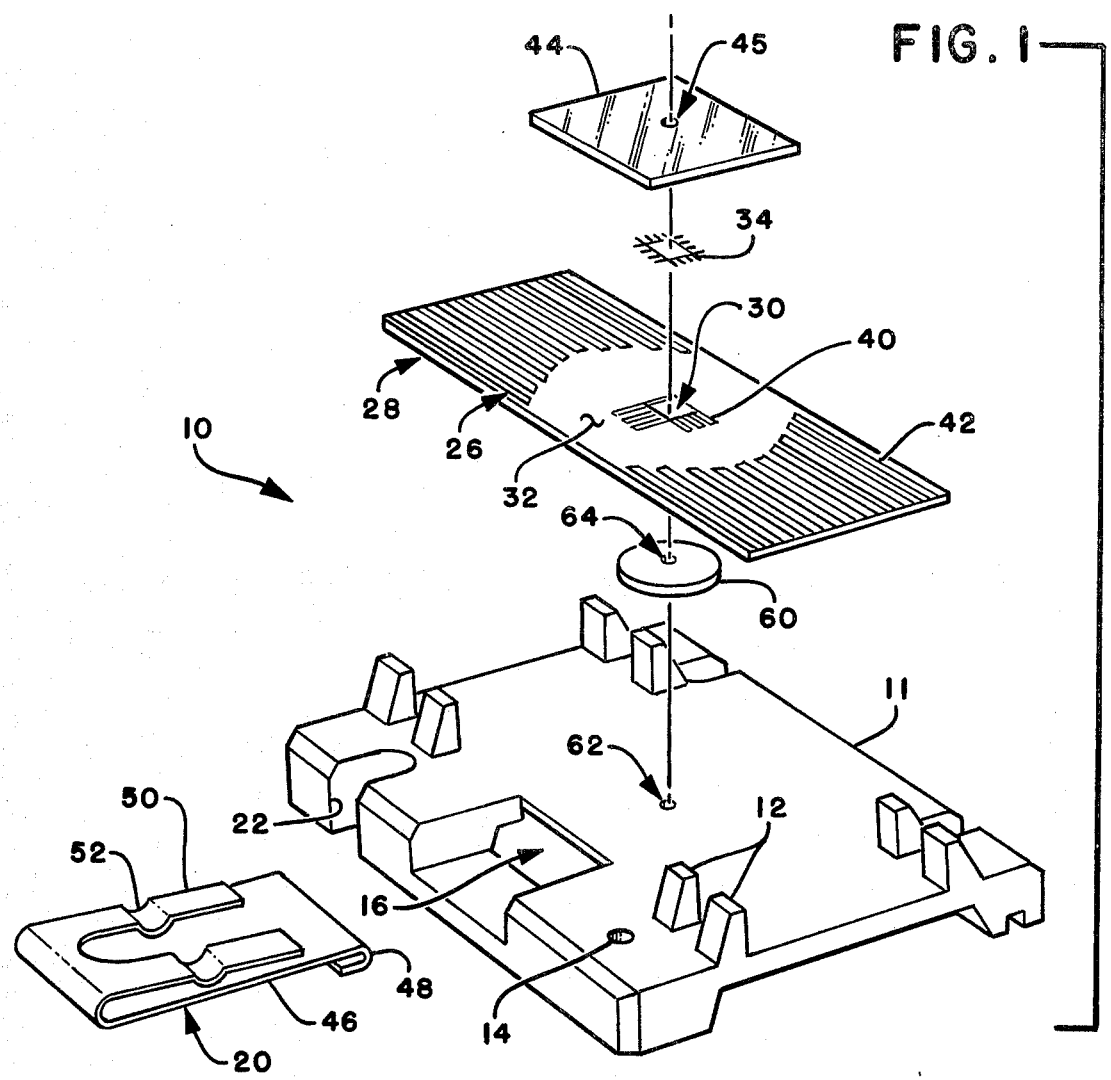
FIG. 1
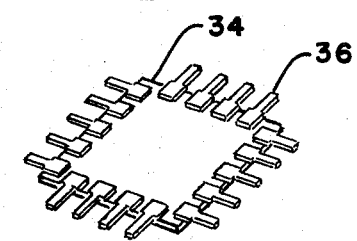
FIG. 2
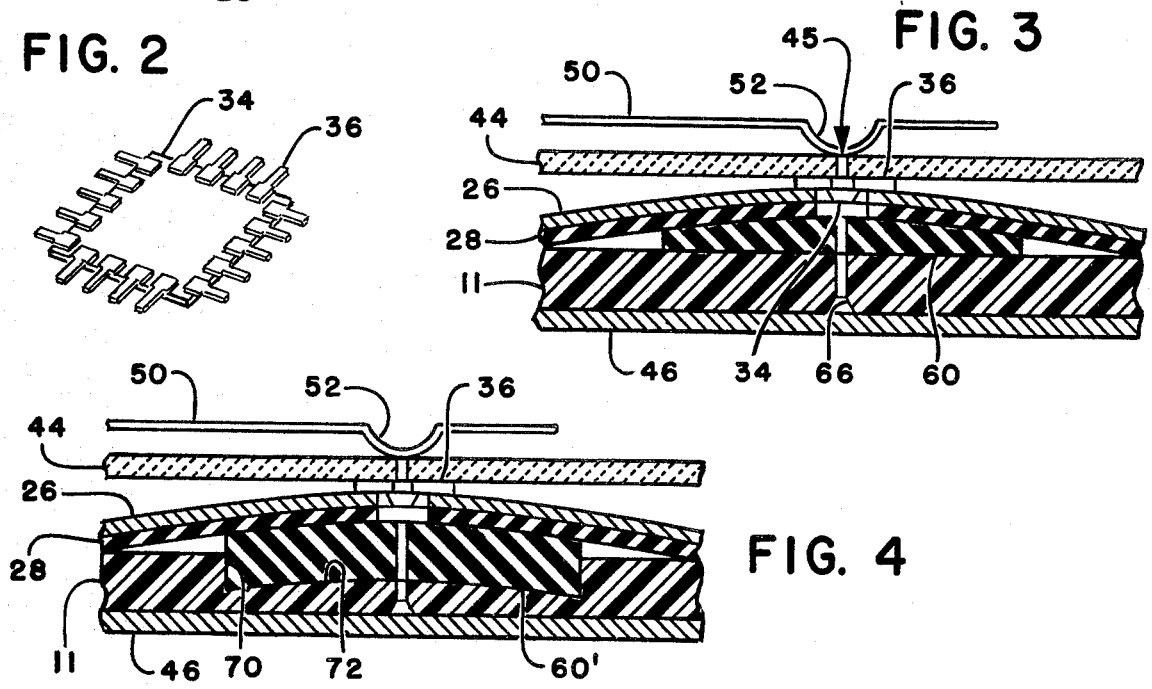
FIG. 3
FIG. 4

PROTECTIVE CARRIER FOR MICROCIRCUIT DEVICES

BACKGROUND OF INVENTION

The invention relates to an improved protective carrier for microcircuit devices having beam leads.

Protective carriers useful for transporting, handling and testing microcircuit devices such as semiconductor chips which have beam leads, without removing the devices from the carriers are known. One type of protective carrier is described in U.S. Pat. No. 3,823,350, to Charles L. Stoner, dated Jul. 9. 1974. Other protective carriers employ generally planar bases which have locking slots, alignment projections, apertures, and the like, a printed circuit board or circuit element on the carrier base with a cavity therein adapted to receive the microcircuit device and having a plurality of electrical paths each of which have an end adjacent the cavity on the circuit element, microcircuit device beam leads aligned with corresponding electrical paths on the circuit element, a cover member over the microcircuit device and in contact with the beam leads, and finally means for locking or compressing the cover member against the beam leads to provide electrical contact with electrical paths on the circuit element and concurrently retain the beam leads in alignment with corresponding electrical paths on circuit board during handling and testing.

A limitation in this described device is that reliable electrical contact between the beam leads and the electrical paths may not always be achieved due to differences or variations in the flatness of the cover member or the carrier base, or variations in thickness of the beam leads or in projection of the electrical paths from the circuit element, or the like. When good contact is not made, erroneous measurements or indications of circuit failure may occur when the microcircuit device is checked in the carrier. As such, a protective carrier which provides reliable electrical contact between the beam leads and the electrical paths on the circuit board is desired.

SUMMARY OF INVENTION

In view of the above limitations, it is an object of this invention to provide an improved protective carrier for microcircuit devices having beam leads which provides reliable electrical contact between beam leads on the microcircuit devices and electrical paths on a circuit element carried by the protective carrier device.

It is a further object of this invention to provide an improved protective carrier for microcircuit devices such as semiconductor chips with beam leads, which carrier provides reliable electrical contact between the beam leads and the electrical paths on a circuit element on the carrier despite variations in thicknesses of the beam leads, or variation in projection of the electrical paths from the circuit board, or despite differences in flatness or thickness of the carrier substrate or cover member.

Various other objects and advantages will appear from the following description of the invention and the most novel features will be pointed out hereinafter in connection with the amended claims. It will be understood that various changes of the details and structure of the embodiment herein described in order to explain the nature of the invention may be made by those skilled in the art without departing from the principals and scope of this invention.

The invention comprises an improved protective carrier for microcircuit devices having beam leads, wherein the carrier includes a base and a flexible circuit board carried by the base, the board having an aperture therethrough adapted to receive the microcircuit device and also having a plurality of electrical paths, each of which has an end adjacent the aperture and oriented to contact corresponding beam leads of a microcircuit device, a cover member disposed over the microcircuit contacting the beam leads, and a locking member which provides compressive force against the cover member to contact and retain the beam leads in alignment with the electrical paths on the circuit element during handling and testing of the microcircuit device, wherein the improvement resides in providing a compressible member between the carrier base and the circuit element and disposed beneath the circuit element aperture and substantially overlapping a portion of the circuit element around or adjacent the aperture periphery thereby providing reliable electrical contact between the beam leads and the electrical paths by the flexible circuit element to deflect, bulge or flex and conform to the microcircuit device beam lead contacting surfaces as well as to allow for variations in thicknesses of the beam leads or circuit element electrical paths.

DESCRIPTION OF DRAWING

FIG. 1 is an enlarged, exploded perspective view of the carrier in accordance with this invention;

FIG. 2 is a simplified, enlarged view of a beam lead microcircuit device of a type usable in this invention;

FIG. 3 is a cross-sectional illustration, of an assembled portion of the embodiment shown in FIG. 1; and FIG. 4 is a cross-sectional view of a portion of an alternate embodiment of this invention.

DETAILED DESCRIPTION

As shown in FIG. 1, the protective carrier device 10 includes a generally planar carrier base or substrate 11 which may include a locking slot or aperture 16 which cooperates with a suitable retaining member, such as a spring retainer or locking member 20 as will be described hereinbelow, to apply a force against the carrier cover to lock the beam lead device in a compressed mode while the cover also remains in compression. Substrate 11 may also have various other cutout portions 22, grooves, aligning port 14, raised portions or aligning projections 12, and the like for the purpose of aligning the carrier base with respect to microcircuit device loading equipment, testing equipment, etc.

A plurality of electrically conductive leads or paths 26 may be disposed on a surface 32 of a suitable circuit element or board member 28, such as a printed circuit board, suitably supported on substrate 11, such as by adhesive bonding, between projections 12. Element 28 may be provided with a cavity, passageway or opening 30 passing through element 28 at some portion of its face or surface 32. Opening 30 is adapted to receive a microcircuit device or a portion thereof, such as a beam lead device 34, as shown in FIG. 2, which device has a plurality of beam leads 36 extending therefrom arranged to correspond and electrically mate with electrical paths 26 to align the beam leads 32 into contact with particular ones of paths 26. Leads 26 may be made integral with or otherwise disposed on circuit element 28 surface 32 through methods well known in the art, such as by vacuum deposition or sputtering techniques directly onto board 28, or by deposition upon a suitable film which may be subsequently bonded to board 28. The number and arrangements of electrical paths 26 will be dependent upon the number and orientation of the beam leads 36 in device 34 which is to be carried by carrier 10. It may be desirable that electrical paths 26 adjacent opening 30 have a narrower portion 40 extending near to or adjacent passageway 30 and terminating in a size commensurate with the width of beam leads 36, and a wider portion 42 removed therefrom and extending to or near edge portions of element 28 so as to facilitate making electrical contact with paths 26 and testing of the microcircuit devices carried by the protective carrier device 10.

A slide retainer or cover member 44 is disposed over the microcicuit device 34 and coacts with spring retainer or locking member 20 to lock the microcircuit device in a compressed mode against element 28. Thus when retained on carrier base 11 by means of locking member 20, the cover urges the beam leads 36 toward electrical contact with electrically conductive paths or leads 26. Cover member 44 may be of any suitable thickness such as about 0.02 inch, and may be of any suitable material. A clear glass cover member 44 may be desirable that is sufficiently transparent so that objects having dimensions smaller than 0.001 inch can be readily inspected through the glass using magnification and light levels commensurate with details to be inspected. Cover 44 may include an aperture or opening 45 therethrough which permits the use of appropriate vacuum probe devices during loading or unloading of the carrier with the microcircuit devices.

Locking member 20 may comprise a generally planar bottom portion 46 having a sloping or curved front portion 48 and a pair of spring fingers 50 which slide over and retain cover member 44 in position. Front curved portion 48 facilitates the entrance of locking member 20 into locking slot or aperture 16 as well as provides a means for opening member 20 during insertion and withdrawal. Spring fingers 50 also have one or more inwardly depressed portions 52 which serve to distribute the compressive force onto cover member 44. In using spring fingers 50 each having one depressed portion 52, it may be desirable to locate or position the depressed portion 52 a predetermined distance with respect to portion 48 so that when assembled, the depressed portion 52 lies over the carrier base center line.

As described to this point, the protective carrier may not, in every instance, reliably provide electrical interconnection between electrical paths 26 and beam leads 36 when there is a variation in size of beam lead thickness, or when the bottom side of carrier base 11 is not flat to correspond with slide retainer 44, or in other like circumstances. In order to overcome or minimize these problems, a compressible or "compliant" member or pad 60 which may be of circular, rectangular, square, or any desired configuration, and which may be made of such as an elastomeric material or a polyamide material or a fluorocarbon such as polytetrafluoroethylene, or the like, is disposed beneath opening 30 and substantially overlapping areas adjacent the periphery of the opening or aperture 30 onto the bottom side of circuit element 28 in order to provide or achieve flexing or deflection of the board member with the thickness variations on the beam leads when the compressive force is exerted upon cover member 44 by spring fingers 50 of locking member 20. Portions 52 may be positioned along fingers 50 so as to be outwardly disposed from marginal portions of device 34 and to apply a compressive force to cover member 44 in conjunction with the compliant pad 60 described below to insure contact between beam leads 36 and conductive paths 26.

The yieldable or compliant pad or member 60 as well as element 28 may be suitably attached to carrier 11 through any suitable means such as by the use of an adhesive. If element 28 is adhesively bonded to base 11, a space having a width of from about 0.063 to about 0.13 inch may be left free of adhesive around the pad to permit adequate flexure of the circuit board. The minimum pad thickness may be arrived at by considering variations in the base flatness, the circuit board thickness, the cover flatness, the beam thickness, etc.. Maximum pad thickness may be arrived at by considering the mechanical stability of the loaded carrier, distortion of the circuit board and differential linear coefficient of thermal expansion, etc.. The thickness of pad 60 may be such as from about 0.002 inch to about 0.008 inch and it overlaps the edges around the opening or aperture 30 at least 0.010 inch at any one point. It may be desired that the pad thickness be at least 0.005 inch and have a diameter of 0.250 inch. In one application, the opening 30 measured 0.065 inch by 0.065 inch while the circular compliant member had a diameter of about 0.281 inches. Other pad thicknesses and diameters may be employed.

Carrier base 11 may have a passageway 62 in line with a passageway 64 in compliant pad 60 and in line with opening 30 of element 28. Passageway 62 may have a flared or widened cone shaped portion 66, as shown in the drawings, which facilitates placement of appropriate vacuum probes or the like over passageway 62 flared portion 66 to retain device 34 in position while the cover member is positioned.

FIG. 3 graphically illustrates how the use of pad 60 enables the electrical contact between electrical leads 26 and beam leads 36 to be effected; if one beam lead has a greater thickness than others, pad 60 would be compressed more under the beam lead that was of greater thickness and board 28 would be flexed until the thinner beam leads made electrical contact with the corresponding electrical lead. One can readily understand that if pad 60 were not present in the FIG. 3 illustration, there would be no room for board 28 to flex or move and thus electrical contact with the thinner of the beam leads would not be effected.

FIG. 4 illustrates an alternate embodiment of this invention wherein a cavity 70 is disposed in substrate 11 and an oversized pad 60' is then placed in cavity 70 for the same purpose as described for FIG. 3. The use of cavity 70 permits greater flexibility in types of pressures exerted and allows a greater assurance that the electrical contact between beam leads 36 and electrical conductors 26 will be effected. It may be desired to provide an upwardly convex bottom wall 72 in cavity 70 so that the center of the pad is slightly raised. This reduces the possibility of the bottom wall being concave during manufacturing of the base and enhances electrical contact between the bam leads and the electrically conductive paths on element 28.

Thickness of pad 60 may typically be such as about 0.005 inch and the thickness of pad 60' may be such as about 0.015 inch, with a depth of the cavity 70 of about 0.010 inch. It is desirable that the pad 60, 60' extend laterally beyond the area of the microcircuit device beams 36 by at least 0.010 inch.

The dimensions of the microcircuit devices and the beam leads on said devices may vary, but typical dimensions are about 0.063 inch wide by 0.063 inch long for the microcircuit device and about 0.005 inch long by about 0.003 inch wide for the beam leads 36. Microcircuit devices are preferably disposed within opening 30 so as not to touch any portion of board 28, such that the cover member 44 effects contact only with the beam leads.

The protective carrier device described herein provides safe transportation of microcircuit devices having beam leads, and further provides reliable electrial contact between the electrical paths 26 on the test board 28 and the beam leads 36 on the microcircuit device 34 being carried. This protective carrier device not only provides for handling of the microcircuit devices, but also provides for testing of the microcircuit devices within the carrier. As known in the art, any number of beam leads or microcircuit devices may be used herein simply by providing a corresponding number of electrical paths 26 on the board 28 and corresponding changes in shape, dimension and position of paths 26 in relation to other beam lead microcircuit devices.

What is claimed is:

1. A carrier for use in handling and testing operations on microcircuit devices having beam leads, said carrier including a base, a flexible circuit element on said base having an aperture therethrough adapted to receive one of said microcircuit devices, a plurality of electrically conductive paths on a surface of said element with each of said paths having an inner end adjacent said aperture and an outer end remote therefrom for contacting with said inner ends corresponding ends of said beam leads of said microcircuit devices, a cover member disposed generally over said microcicuit device and said beam leads, retaining means for compressing said cover member against said beam leads and retaining said beam leads in a fixed orientation with respect to said correspondng paths and towards electrial contact therewith, and a compressible member beneath said aperture and adjacent areas of said flexible circuit element and of a thickness to deflect said element areas upwardly toward a said device and beam leads thereof and provide firm electrical contact between said beam leads and said corresponding conductive paths.

2. The carrier device of claim 1 wherein said base includes a cavity formed by a side wall and a bottom wall beneath said aperture in said circuit element and said compressible member is disposed within said cavity and projects above the surface of said base intermediate said board member and said base.

3. The carrier device of claim 2 wherein said bottom wall is upwardly convex.

4. The carrier device of claim 1 wherein said cover member includes an aperture therethrough for application of vacuum in loading and unloading said microcircuit device on said carrier device.

5. The carrier device of claim 1 wherein said carrier base has an opening therethrough, said pad contains an opening therethrough in registry with said base opening and said microcircuit device, said base opening and said pad opening for application of vacuum in loading and unloading said microcircuit device on said carrier device.

* * * * *